United States Patent [19]

Hester

[11] E Patent Number: Re. 31,704

[45] Reissued Date of Patent: Oct. 9, 1984

[54] TRANSFORMER HAVING NOVEL MULTIPLE WINDING AND SUPPORT STRUCTURE AND METHOD OF MAKING SAME

[75] Inventor: Thomas E. Hester, Ft. Wayne, Ind.

[73] Assignee: Litton Systems, Inc., Beverly Hills, Calif.

[21] Appl. No.: 376,638

[22] Filed: May 10, 1982

Related U.S. Patent Documents

Reissue of:

[64] Patent No.: 4,249,229
Issued: Feb. 3, 1981
Appl. No.: 937,466
Filed: Aug. 28, 1978

[51] Int. Cl.[3] ..... H05K 7/02; H01F 15/02

[52] U.S. Cl. ..... 361/399; 29/605; 29/606; 336/65; 336/172; 336/189; 336/200; 336/205; 361/331; 361/400

[58] Field of Search ..... 336/205, 206, 200, 223, 336/65, 180, 182, 183, 172, 184, 96; 29/602 R, 605, 606; 361/331, 400, 395

[56] References Cited

U.S. PATENT DOCUMENTS

| | | | |
|---|---|---|---|
| 217,466 | 7/1879 | Le Conte | 336/206 X |
| 901,299 | 10/1908 | Kitsee | 336/206 X |
| 2,399,182 | 6/1952 | Kerns | 336/223 X |
| 3,102,245 | 8/1963 | Lawson, Jr. | 336/200 X |
| 3,153,216 | 10/1964 | Klitten | 336/183 X |
| 3,891,955 | 6/1975 | Horton | 336/223 |

FOREIGN PATENT DOCUMENTS

| | | | |
|---|---|---|---|
| 2541871 | 3/1977 | Fed. Rep. of Germany | 336/205 |
| 1491905 | 8/1967 | France | 336/200 |
| 468065 | 3/1969 | Switzerland | 336/200 |
| 771701 | 4/1957 | United Kingdom | 336/200 |
| 1021344 | 3/1966 | United Kingdom | 336/206 |

*Primary Examiner*—Thomas J. Kozma
*Attorney, Agent, or Firm*—John M. Haurykiewicz; Walter R. Thiel; Robert A. Seldon

[57] ABSTRACT

Electrical apparatus includes electrical coil means formed of multiple turns of enamel-covered electrical wire axially mounted on a core of magnetic material in electromagnetic energy coupling relationship therewith, and a relatively flat flexible electrical cable containing a plurality of spaced parallel conductors extending between the cable ends contains a loop shaped portion extending about an axis of said core over an arcuate distance greater than 180 degrees. The method of adding a plurality of electrical windings to an electrical transformer of the type containing electrical coil means having a primary winding and at least one secondary winding, with said coil means having a central axis and a central passage coaxial with said axis; a core of magnetic material with said core having a portion extending through said central passage to support said coil means thereon, includes the step of forming into a loop extending about the axis of said coil an elongated flat cable of the type containing a plurality of spaced parallel electrical conductors insulated from one another.

15 Claims, 13 Drawing Figures

TRANSFORMER HAVING NOVEL MULTIPLE WINDING AND SUPPORT STRUCTURE AND METHOD OF MAKING SAME

Matter enclosed in heavy brackets [ ] appears in the original patent but forms no part of this reissue specification; matter printed in italics indicates the additions made by reissue.

BACKGROUND OF THE INVENTION

The present invention relates to electrical transformers and, more particularly, my invention relates to inverter type ferrite core transformers of the type containing a plurality of fractional or single turn secondary windings, to the method of manufacturing such windings and to supporting the transformer in the combination of an electrical device.

The transformer is a known electrical component which contains at least two electrical windings formed into a coil or coils mounted on a core of magnetic material by means of which AC electrical energy is coupled from one winding to the other, respectively termed the "primary" and the "secondary". Generally each of those windings are formed of a large number of turns of electrical enamel coated wire fabricated in the form of a coil by means of conventional coil-winding machinery. Thereafter in the assembly of the transformer the formed coil is mounted to the core of magnetic material. Generally, the voltage relationship between the primary winding and the secondary winding or windings is governed in great part by the "turns ratio"; the ratio of turns in a secondary to the turns of the primary. Where the ratio is greater than one a "step-up" voltage relationship exists and where less than one, a "step-down" relationship exists. By design a transformer may contain one or the other or both step-up and step-down windings. Each of these prior art structures permit of many variations and methods of manufacture which are widely known in the industry and in the patent literature, to which the reader may make reference. By way of further background it is recalled by those skilled in this art that manufacture of electrical coils for transformer application involves winding of the coil on coil-winding machinery, using typically enamel coated wire, and involves set-up procedures requiring time and labor. In many transformer coils the beginning, tap and end turns of the enamel coated wire windings are connected to separate electrical insulated jacketed leads respectively, to form the circuit connections by means of which the transformer windings are connected electrically to other circuits. In other structures the end leads may be connected to electrical terminals built into coil bobbins used in connection with some transformers of more expensive structure so that the transformer may be easily "plugged-in" to a printed circuit board. In one type of electronic device, namely a solid state inverter-oscillator type circuit, for operating one or more gaseous discharge devices, such as a fluorescent lamp of the rapid start type, circuitry is included for converting either low voltage DC or AC line voltage of low frequency, typically 60 hertz, to the high-voltage high-frequency energy supplied to the lamp, as well as to provide low-voltage current to the lamp's heaters. This electronic device includes a transformer containing a primary winding and a plurality of secondary windings which are located on a core of magnetic material, such as the conventional ferrite core material useful at high frequencies or magnetic steel laminations formed into a transformer core. Although a high-voltage secondary winding is required containing a large number of turns of enamel coated wire efficiently assembled by high speed coil winding machinery, other secondary windings intended in the apparatus to provide the heater currents at low voltage to the fluorescent lamp cathodes, require only one or two turns at most. In the case of a solid state ballast intended to operate two rapid-start type lamps, for example, there is a requirement for three such low voltage heater windings consisting of a single wire turn, at least one additional low voltage winding for which a single wire turn supplies satisfactory voltage, and a further secondary winding intended to supply electrical components within the device requiring only two turns of wire. In other applications a fractional turn winding of ½ turn or 3/2 turns is all that is required. As the reader familiar with the methods of transformers manufacture can appreciate, to accomplish winding manufacture according to the one existing procedure would require the winding and insulation of a plurality of single turns of wire which, if enamel wire were used, may require the attachment of electrical jacketed leads, as described above, or to alternatively wind the individual one turn windings with insulation jacketed wire. Obviously a certain amount of time and effort is involved in handling a number of these low voltage secondary windings and this time and effort accordingly is equated with unnecessary expense in manufacture and is necessarily reflected in the price of the product. A higher price for a product in turn acts to limit its marketability, even though the product is technically innovative and possesses attractive advantages, if the cost of obtaining those advantages is too great in comparison to conventional or old methods of obtaining the essential functions performed by the product. Specifically, by way of example, the solid state type of fluorescent lamp ballast possesses many advantages over the conventional electromagnetic type for which it may serve as a substitute. The present cost of such solid state ballast, however, is one factor that has heretofore limited marketability since in the minds of many potential buyers the additional cost exceeds the additional benefits from such substitution.

My invention simplifies the winding structure and assembly of transformers having some secondary windings containing but a fractional or small number of turns and thereby reduces the cost of manufacture of solid state inverter type ballast incorporating a transformer, and, more particularly, reduces the cost of manufacture of the transformer as a major advantage. A related object is to provide a transformer containing a plurality of single turn windings and a method of manufacturing same without the necessity of separately handling individual turns. A still further aspect of the invention is to provide a transformer winding structure which assists in supporting the transformer upon a printed circuit board.

SUMMARY OF THE INVENTION

Briefly, my invention in a transformer, includes a core of magnetic material; electrical coil means containing a plurality of turns of enamel covered electrical wire formed about an axis, said coil means mounted axially on said core; a flat electrically insulated cable containing a plurality of spaced apart parallelly extending conductors, said cable having a loop shaped portion extending about the periphery of said coil means, said loop shaped portion extending an arcuate distance greater than 180 degrees about the axis of said coil, and said cable containing first and second ends.

Commencing with a transformer structure containing an iron core having an electrical coil mounted thereon in electromagnetic energy coupling relationship therewith, a plurality of single turn secondary windings is formed by the step of threading or looping, as variously termed, about the outer periphery of the electrical coil a flat cable containing a plurality of spaced electrical conductors. Further, in accordance with the method of my invention, an electrical printed circuit board is provided containing electrical terminals adapted to mate with the conductors of the aforedescribed cable.

A printed conductor on the circuit board extends between one terminal of the group of terminals intended to be attached to one end of said cable to a terminal of the second group of terminals intended to be connected to the remaining end of said flat cable to thereby define in combination with a conductor in said cable a portion of a winding turn on said circuit board with the step of connecting each end of the cable to the corresponding terminals on said circuit board serving to complete a secondary winding and to form a strap-like arrangement to provide a holding force for holding the transformer at least temporarily in position on said circuit.

The foregoing objects and advantages of my invention together with the structure and steps characteristic thereof, as well as additional advantages and equivalent elements, are better understood by considering the preferred embodiments of the invention described in the detailed description which follows hereinafter in this specification in connection with the illustrations thereof presented in the drawings.

DESCRIPTION OF THE PREFERRED EMBODIMENTS

Figure 1:
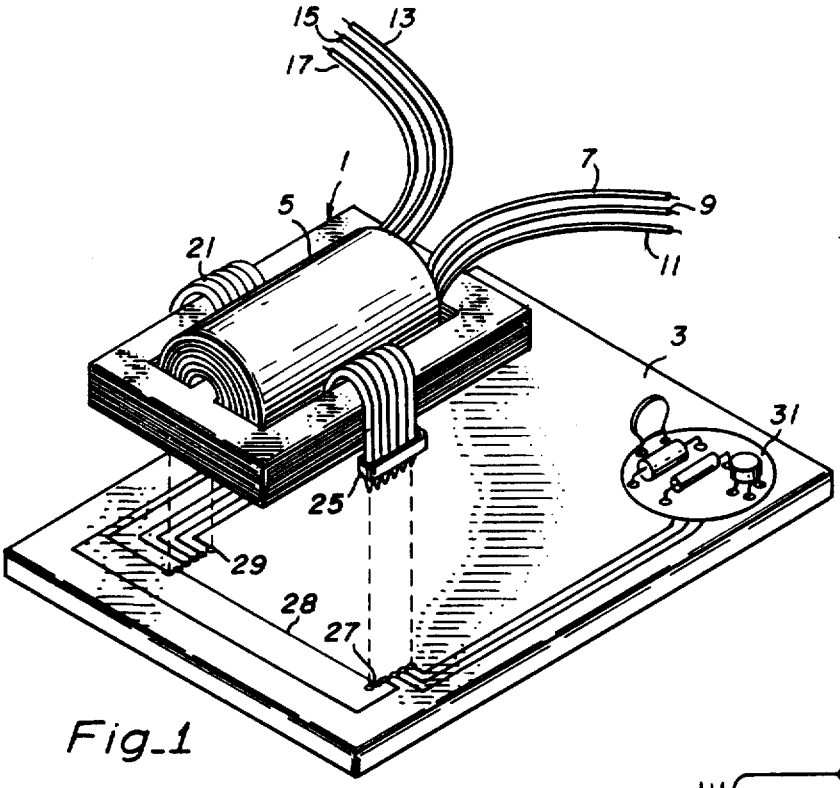
FIG. 1 illustrates an embodiment of the invention in exploded view.

Reference is made to the embodiment presented in FIG. 1 in which the transformer, including core 1 of magnetic material, is illustrated in exploded relationship to a printed circuit board 3 which underlies the core. The magnetic core, suitably of magnetic material such as ferrite, possesses an "E-I" configuration known in the art, defining a center leg upon which an electrical coil 5 is mounted and two opposed outer legs which extend parallel to the center leg, and defining in the space between the described parallel legs two core windows in which coil 5 is received. Electrical coil 5 is of any conventional electrical coil structure configured into a cylindrical or rectangular shape having a central axial passage and containing a primary winding to which start 7, finish 9 and center tap 11 leads are attached and an overlying multiturn high voltage secondary winding to which leads 13, 15 and 17 are attached as the start, finish and center tap. The coil is inserted onto the center core leg which extends through the coil's central passage. It is noted that although the aforedescribed windings are described as being in overlying relationship, it is clearly within the scope of the present invention, as becomes apparent, for these two windings to be formed as separate coils arranged in a side-by-side relationship. As is depicted in FIG. 1, some clearance is provided between the periphery of coil 5 and the outer core legs. A relatively flat cable 21 is threaded or inserted through the clearance between coil 5 and one outer core leg on one side and loops around or girdles the underside of the coil, not visible in this figure, extends through the remaining clearance between the coil and the remaining outer leg. Connectors 23 and 25 containing suitable electrical terminals are attached to a respective end of this cable. As is there shown, the cable is then wrapped around the outer core legs as well as the coil, much like a strap. As is further depicted, cable 21 is seen to contain six parallely extending conductors in spaced relationship electrically insulated from one another as part of a thin flexible plastic-like carrier that is flat, having a width many times greater than its thickness so as to be ribbon-like in appearance. These kinds of flat cables are well known in the art; one type is available as a plurality of separate jacketed wires with jackets fused together in a layer which appear to be the cable product sold under the trade name "Scotchflex" by the 3M Company, and another type is known as a ribbon cable, in which flat conductors are formed within a flat plastic matrix. These cables have generally been used to provide flexible electrical interconnections in applications requiring large numbers of interconnections, typically in computer or data processing apparatus. Circuit board 3 underlying the transformer includes a group of six spaced electrical socket openings or terminals, generally represented at 27, with which to form mating electrical interconnection with the protruding terminals of cable connector 25 and these may be soldered together in place. Similarly, the left side of the circuit board is a second group of six spaced socket openings or terminals generally represented as 29 into which the extending prongs, not visible in the figure, of connector 23 attached to the left end of cable 21 may be inserted and soldered to form an electrical and mechanical connection therewith.

As so joined together, a firm mechanical bond is created between the cable ends and the circuit board. Inasmuch as the cable is strapped about the outer legs of transformer 1, such strapping serves as a restraint to hold the transformer in place upon the circuit board. In addition, inasmuch as each of the conductors within the cable extends arcuately at least half-way or 180 degrees around the center core leg, a corresponding plurality of one-turn windings, so to speak, is formed.

The circuit board of a typical electronic apparatus, such as a solid state ballast, contains a plurality of other electrical components including transistors, capacitors, resistors, generally represented at 31, the exact details of which are not necessary to the understanding of the invention but which are partially illustrated in figure simply for completeness. Likewise, electrical conductors extend on the upper surface as shown, or, alternatively, along the underside of the board from each of the contacts in the group 27 and 29 to suitable locations within the electronic circuit 31. Attention is drawn to conductor 28 on the circuit board which extends from the first terminal in group of terminals 27 to the second terminal in group of terminals 29. With the cable connected in place to the corresponding terminals, an electrical circuit or path is formed which extends from the first terminal in group 29 through the cable and one turn part way around the periphery of coil 5 to the first terminal in group 27, and from that location extends through conductor 28 to the second terminal of the left hand group of terminals, and extends further through the second adjacent conductor in cable 21 and again part way around the coil periphery and core to the second terminal in the terminal group 27. The defined electrical path thus extends twice around the core of the transformer to thereby form a "two-turn" secondary winding. By contrast, each of the other defined electrical paths illustrated simply extend about the coil and core between the opposed terminals of the two groups to thus each form a single turn secondary winding.

Figure 2:
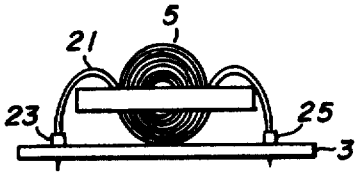
FIG. 2 is an end view of the embodiment of FIG. 1 in assembled relation.
Figure 3:
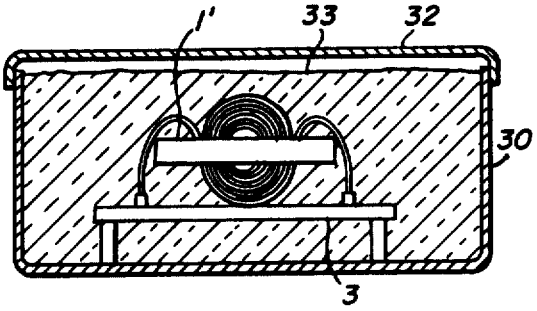
FIG. 3 is an end section view of the embodiment of FIG. 1 installed in a container.

The embodiment of FIG. 1 as assembled is depicted in an end view in FIG. 2 illustrated to a slightly reduced scale. Accordingly, the elements in FIG. 2 are identified by the same numerals used in connection with the illustration of FIG. 1. There is visible in this view circuit board 3, the transformer coil 5, cable 21 with the left end connector 23 and the right end connector 25 engaged in the terminals, the latter of which are not visible in this view. As is clearly illustrated, cable 21 winds around the underside of the coil 5 and extends through the core so as to form a loop or arc, as variously termed, which extends around the coil over a distance of more than 180 degrees ($\pi$ radians) and though in the literal sense is less than a complete turn of 360 degrees, each conductor of the cable is effectively a one-turn or single turn transformer winding. Moreover, the cable 21 is seen to serve as a strap in that it folds over and around each of the outer core legs, thereby restraining movement of the transformer away from the circuit board. It is understood, however, that the restraint or support provided by this cable or winding for the transformer on the circuit board may by itself be sufficient to hold the transformer in place. However, it is recognized that other electrical connections may be made between the transformer windings and the circuit board which will serve to provide additional support. The advantage, either separately or in combination with additional restraints, is that the transformer may be held in place without the necessity for screws, bolts, and brackets. By way of further improvement upon this support function, reference may be made to FIG. 3 in which I depict in an end view schematically the assembly 3 which may be representative of a completed circuit board containing an inverter-oscillator type arrangement for operating one or more fluorescent type lamps which is normally placed in a container 30 having a lid 32 and having one container "potted" or encased in a known electrically insulative heat conductive potting compound 33, as represented in the figure. Those types of thermal setting or thermoplastic type potting compounds are well known in this kind of application, such as asphalt, which are inserted in a liquid state and after curing either by standing or by heating form a solid body and adhere to the walls of the container as well. This potting material serves to encase and hold in place transformer 1 very securely and in this sense the strap serves a temporary support function prior to the time the entire unit, including the transformer and circuit board, is encased in the epoxy. The arrangement avoids need for screws and bolts to provide such a temporary fastening.

Figure 4:
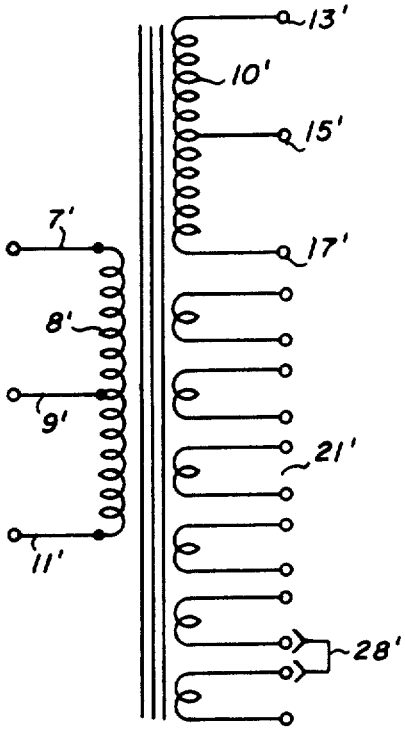
FIG. 4 is an electrical schematic of the transformer of FIG. 1.

The transformer of FIG. 1 may be represented by an electrical schematic depicted in FIG. 4, in which the core is represented by the three parallel lines, the primary winding 8' containing the leads 7', 9' and 11', the high voltage secondary 10 containing the leads 13', 15' and 17', referred to in the figure, as well as the plurality of single turn windings 21' formed by cable 21 and the single "two-turn" winding formed by two of the leads in the cable in combination with the conductor on the circuit board, represented by a dash line bridging conductor 28' in this schematic. As in all transformers, each of the windings are "electromagnetically" coupled to another and to the core of magnetic material.

Given the preceding description of the electrical and mechanical structure of the preferred embodiment of my invention, the alternate embodiments are easily understood and variations on all of the structures suggest themselves to the skilled reader. For convenience, similar parts used in the alternate embodiments are identified by the same numbers as corresponding elements earlier presented and distinguished by the addition of a single or double prime in conjunction with the number.

Figure 5:
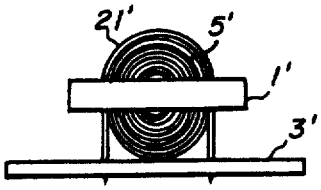
FIG. 5 is an end view of an alternate embodiment of my invention.

As represented in FIG. 5, a transformer having an E-I type magnetic core 1' is shown in end perspective view and contains coil 5' comprised of a primary and a secondary winding, each containing a large number of turns of enamel insulated wire, and a cable 21', with the entire assembly supported upon circuit board 3'. In this embodiment, the ends of the cable do not include the cable connectors shown in the earlier embodiment but the cable ends are stripped of insulation and the exposed conductors are inserted directly into the corresponding terminal openings located in circuit board 3' and are soldered in place. Cable 21' extends in a loop about the outer periphery of coil 5', over an arcuate length of at least 180 degrees around the axis of the coil, with the ends of the cable extending through the clearance space between each of the outer core legs and the peripheral surface of coil 5'. As in the earlier described embodiment, cable 21' forms a straplike restraint holding the transformer to the board with the assistance of the solder which forms the electrical and mechanical coupling between the cable ends and the circuit board.

As is apparent, the loop formed by the cable extends at least 180 degrees but less than 360 degrees arcuate distance about the periphery of coil 5'. It is clear that the embodiments of FIGS. 4 and 5 may be modified to include cable connectors, such as connectors 23 and 25 of FIG. 1. Likewise, rather than directly plugging these connectors directly into the circuit board, corresponding mating connectors may be mounted to the circuit board to which the cable connected connectors may be coupled to form an electrical and mechanical juncture. I prefer any particular structure which satisfied good practices and is satisfactory for any particular application at the lowest possible cost.

Briefly, making reference again to the embodiment of FIG. 1, I there illustrate the structure by means of which a plurality of voltage step-down secondary windings, each of a single turn, are formed simply by looping or placing a flat multiconductor cable around the periphery of a mounted coil, including the axially extending core portion, over an arcuate distance about that axis of at least 180 degrees, as well as the structure for providing a coil of two turns by using at least two of the parallel extending conductors in the cable in conjunction with a printed conductor 28 located on the surface of circuit board 3, which printed conductor extends between one terminal in the right hand group of terminals 27 to another terminal in the left hand group of terminals 29. Considering the terminals in group 27 as A, B, C, D, E and F, from front to back, with A the closest to the viewer, and corresponding terminals in terminal group 29 similarly characterized, the electrical path is defined from terminal A of group 29 through the corresponding conductor in cable 21 around the periphery of the coil to terminal A in terminal group 27, then over conductor 28 across the surface of the board to terminal B in group 29 and from there through the next conductor in cable 21 again around the periphery of coil 5 and the center leg, over to terminal B in group 27. In effect, the electrical path goes around the magnetic core twice as is equivalent to a two-turn coil.

Figure 6:
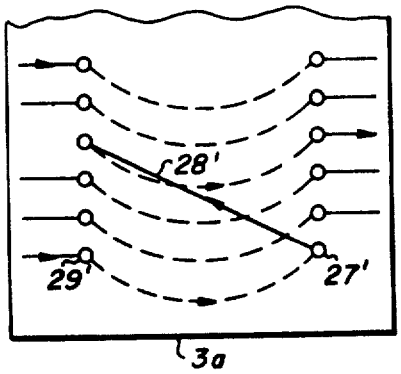
FIG. 6 partially illustrates in different scale a portion of a circuit board useful in the combination of FIG. 1 and the relationship between printed circuit board conductors and the conductors of the ribbon-like cable therein.
Figure 7:
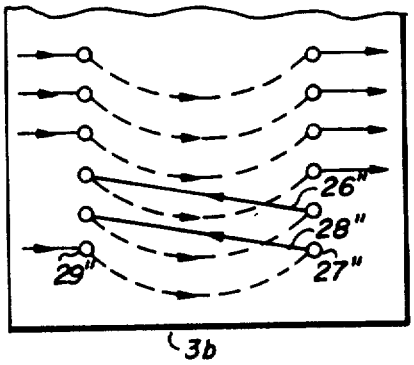
FIG. 7 is a partial illustration of a portion of another circuit board useful in the combination of FIG. 1 to form a two-turn secondary winding.

Other terminal arrangements and conductor arrangements are evident from the foregoing description of the structure of my invention and for illustrative purposes I present examples in FIGS. 6 and 7. In FIG. 6 the electrical conductors within the cable 21, not illustrated in this figure, is represented in dash lines and extend between terminals in circuit board defining the right hand group of terminals 27', and the left hand group of terminals 29' on circuit board 3a, partially illustrated. In this alternative, a double turn coil is formed by conductor 28' extending between the A terminal of group 27' to the E terminal of group 29' with the ends of the two-turn coil appearing at D terminal of group 27' and A terminal of group 29'. As is apparent from the electrical path indicated by the arrows, including those defined through space conductors in the cable, in this variation the two-turn coil is formed using two of the cable conductors which are spaced from one another by two other cable conductors and not adjacent cable conductors as was the case in the embodiment of FIG. 1. There is thus no requirement for the adjacent cable conductors to be used to form a multiturn winding. To add turns to a coil, one simply ensures that the turns in the cable conductor are properly oriented so that the current path always passes in the same direction about the transformer core so that the individual voltages induced in each portion of each turn in the coil combine electrically in an additive manner.

By way of further illustration, a three-turn coil winding arrangement using the aforedescribed cable and circuit board conductor arrangement is illustrated, and in which the circuit board 3b and corresponding terminal groups are identified by the same numerals but double primed. Thus the circuit board 3b in the embodiment of FIG. 7 includes two spaced conductors 28" extending between the A terminal of group 27" and the B terminal of group 29" and additionally a second, essentially parallel conductor, 26', extending between the B terminal of group 27' to the C terminal of group 29'. Additionally, the cable conductors of the cable, not illustrated in this figure, are represented as dash lines extending in a loop between opposed terminals in each group. In the three-turn coil defined, a current path is represented by the arrows extending from the A terminal of group 29" through the cable conductor to the corresponding A terminal of the other group, thence over conductor 28" on the circuit board to the B terminal of group 29", and from that B terminal through the next cable conductor over to the B terminal of group 27", and over the circuit board conductor 26" to the C terminal of group 29 through the third cable conductor to the C terminal of group 27". As represented by the arrows, the electrical current path goes through the cable and around the magnetic core three times in the same direction and hence is effectively a three-turn electrical coil. The connection arrangement of FIG. 7 thus shows a three-turn winding formed between the cable and the conductors on the circuit board in addition to three one-turn secondary windings.

Figure 8:
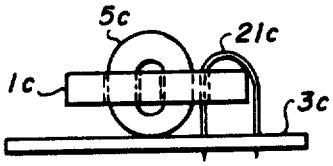
FIG. 8 illustrates in end view an embodiment of the invention containing one-half turn secondary windings.

An addition embodiment of the transformer invention is illustrated in FIG. 8 in which, for convenience, the elements previously illustrated in connection with earlier embodiments and corresponding thereto are identified by the corresponding numeral and a differnet alphabetic character. Thus as depicted in an end view in FIG. 8, core $1_c$ is formed of the E and I magnetic laminations aranged in a conventional structure and an electrical coil $5_c$ mounted to the center core leg. Coil $5_c$ contains a multi-turn primary winding and an overlying multi-turn secondary winding, which in connection with the previous embodiments and one specific example thereof included a ninety turn primary and three single windings and one two-turn winding overlying the secondary. The coil and core structure is situated on top of a printed circuit board $3_c$. The ribbon-like cable 21c is formed into a loop, which loop extends about the axis of the right outer core leg of the core, which core leg appears on the righ-hand side of the figure. One portion of the cable extends through the space in the core "window" between the outer leg and peripheral surface of coil $5_c$ downwardly to an end connection to printed circuit board $3_c$; the other cable portion extends about the outside of the right core leg to a connection on circuit board $3_c$ spaced from the other cable end. As is apparent, the cable forms a loop extending approximately at least 180 degrees about the axis of the right core leg. As in the previously described embodiments of the invention, cable $21_c$ is of a ribbon-like geometry containing at least three and as many as twenty spaced parallel insulated electrical conductors. In the defined structure each of such cable conductors forms a fractional turn secondary winding, more specifically, a one-half turn winding because, as is understood by those skilled in the art, each cable conductor extends through the core window only once. By contrast, in the previous embodiments of FIGS. 1, 2 and 5 the cable extended through the core "windows" twice so that each cable conductor forms one turn or a single-turn secondary winding. As was described previously in connection with FIG. 1 and in the alternative connections of FIG. 6 and FIG. 7, various connecting terminals and printed circuit wiring may be included on a surface of circuit board $3_c$, by means of which one or more of the spaced conductors may be connected to other electrical components not illustrated, or one or more of the cable conductors may be interconnected or linked to form a multiple-turn winding that is some multiple number of one-half turns. And as is apparent, some of the electrical conductors in the cable need not be utilized for practical reasons. For example, assuming a standard ribbon cable can be purchased and contains ten conductors and in a practical embodiment only eight of the conductors are required. It is more cost effective to purchase the standard cable and to use only as many conductors, such as eight, as is needed, leaving the remaining two unutilized, than to purchase a nonstandard cable containing only the precise number of conductors, which is likely to cost substantially more than the standard cable. As in the preceding embodiments, the loop formed of cable $21_c$ forms a strap-like arrangement which partially holds the core $1_c$ and coil $5_c$ upon the circuit board 3c, satisfying a mechanical function.

Figure 9:
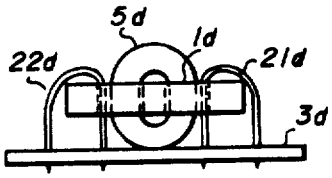
FIG. 9 illustrates in end view another embodiment, the structure of which includes two ribbon-like cables, each of which forms half-turn secondary windings.

A variation of the embodiment presented in FIG. 8 is illustrated in FIG. 9 where similar elements are identified by the same numerals but with a differentiating alphabetic letter. In this embodiment, a first cable $21_d$ is looped about the right hand outer core leg and has its ends connected electrically and mechanically to circuit board $3_d$ as in the embodiment of FIG. 8. In addition, another ribbon-like flat multiconductor cable $22_d$, which may be substantially identical to or different from cable $21_d$, contains a portion looped about the left outer core leg lamination and the ends thereof downwardly depend for connection to circuit board $3_d$. As is apparent, the cable $22_d$ extends through the core window only once. Thus each conductor in the cable forms effectively a one-half turn secondary winding. As in the prior embodiments, the ends of the electrical conductors contained in cable $22_d$ may be connected in circuit with separate electrical components, and may be interconnected to form a secondary winding which consists of some multiple of one-half turn, either or both of which are accomplished by means of electrical conductors printed on circuit board $3_d$. Additionally, the windings formed by the conductors in each of cables $22_d$ and $21_d$ may be suitably interconnected in series aiding or in series opposition by suitable electrical conductors printed upon the circuit board $3_d$, much in the manner described in connection with FIGS. 6 and 7 of the prior embodiments. Many obvious variations of the disclosed electrical interconnections come within the scope of the disclosed invention, all of which become apparent to the skilled transformer designer upon reading this specification and which, in the interest of conciseness, need not be illustrated or described to the infinite degree possible. As is also apparent from the end view of the embodiment of FIG. 9, cables $21_d$ and $22_d$ serve as fastening straps restraining opposite outer core legs of core $1_d$ providing a mechanical restraint holding core $1_d$ and coil $5_d$ upon circuit board $3_d$.

Figure 10:
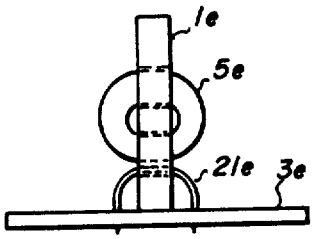
FIG. 10 is an end view of a further embodiment of a transformer containing a plurality of one-half turn secondary windings.

FIG. 10 depicts still another embodiment of the invention distinguishable from the embodiment of FIG. 8 in that the core $1_e$ is mounted in an up-ended position having the outer core leg resting against the upper surface of the printed circuit board $3_e$, the latter of which serves as the support for the assembly of core $1_e$ and coil $5_e$. As shown in this end view, the ribbon-like multiconductor cable $21_e$ is looped about the outer core leg by at least 180 degrees and the cable ends are attached to the circuit board. As in the embodiment of FIG. 8 the cable $21_e$ forms a loop which extends once through the core "window" and hence each conductor in cable $21_e$ forms a fractional, more specifically, a one-half turn secondary. And the winding serves also to strap the core and coil to the circuit board.

Figure 11:
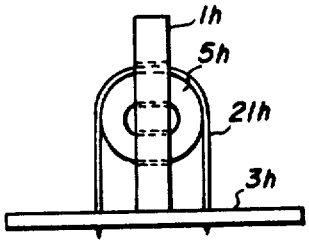
FIG. 11 is an end view of an alternate embodiment related to the embodiments of FIGS. 9 and 10.

An additional embodiment presented in FIG. 11 includes the core $1_h$, the coil $5_h$, and the strap cable $21_h$, mounted to the circuit board $3_h$, with the electrical leads formed at the end of cable 21 mechanically and electrically connected to the board by the solder 12 and 14. In this embodiment the core $1_h$ is upright with an outer core leg located in contact with the circuit board. The transformer is held against the surface of circuit board $3_h$ by the strap-like restraint of cable $21_h$. The cable extends in a loop about the axis of coil $5_h$ and the outer periphery of the coil, as well as about the axis of the center core leg on which coil $5_h$ is mounted, with the strap extending through the clearance between the periphery of coil $5_h$ and the outer core leg located at the topside of the figure.

Figure 12:
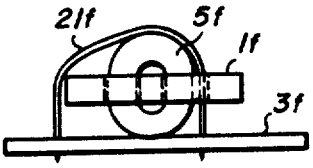
FIG. 12 illustrates in end view a still further embodiment of the invention containing a plurality of one-half turn secondary windings.

A still further embodiment is illustrated in end view in FIG. 12. The coil $5_f$ and the core $1_f$ containing the coil is shown in end view seated upon the printed circuit board $3_f$ which can be considered the same in structure as those corresponding elements of the embodiment of FIG. 8. The multiconductor ribbon-like cable $21_f$ is formed into a wide loop which extends around the periphery of the axis of coil $5_f$ as well as the left side core leg by at least 180 degrees; one depending end length portion of the cable extends through one core window in between the periphery of coil $5_f$ and the inner surfaces of the right hand side outer core leg $1_f$ to the circuit board and the other depending end length portion of the cable extends around the outer surface of the left hand outer core leg and therefrom down to connection with circuit board $3_f$. In this embodiment, a greater length of cable $21_f$ is employed in comparison to that used in the embodiment of FIG. 8 given the same core size. The ribbon-like cable extends much like a wide strap about the core and coil to provide a better mechanical restraint or strap temporarily fastening the core and coil $5_f$ to the board more firmly than in the case of the embodiment of FIG. 8. The plural conductors in cable $21_f$ may be interconnected as desired in the manner described in connection with the preceding embodiments to form either a plurality of secondary windings or at least one secondary winding that is some multiple of a one-half turn.

Figure 13:
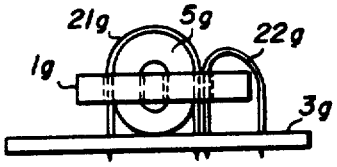
FIG. 13 is an end view of still another embodiment of the invention, the structure of which includes a plurality of single-turn and a plurality of one-half turn secondary windings.

An additional embodiment combines the structure of the single-turn windings presented in the embodiment of FIG. 5 and the structure of the half-turn secondary windings presented in the embodiments of FIGS. 8 through 12 is presented in FIG. 13. Thus, as in the previous embodiments, the magnetic core $1_g$ formed of standard E and I laminations with a center and two outer core legs, defining two core windows, supports the coil $5_g$ axially mounted upon the center core leg and containing the multiturn primary winding and the overlying multiturn secondary winding, which are of conventional coil structure known to those skilled in the art, and the core rests upon the surface of a circuit board $3_g$ as in the embodiments previously described. Multiconductor cable $21_g$ is formed into a loop which, as depicted, extends over the periphery of coil $5_g$ and twice through the core window in between the outer core legs extending about the axis of the coil by at least 180 degrees and has its ends attached to the circuit board corresponding to the embodiment of FIG. 5. Thus each conductor in cable $21_g$ forms a single-turn secondary winding. These individual windings may be separately connected to separate conductors on the board or some of these windings may be electrically interconnected in the manner previously described for the earlier embodiments to place individual windings in series or parallel, particular attention being given to FIGS. 1, 6 and 7 for the connections. A second ribbon-like cable $22_g$ is formed into a loop which extends about the axis of the right-hand outer core leg by at least 180 degrees with one end of the cable extending through a core window. The ends of cable $22_g$ are connected to spaced terminals on circuit board $3_g$. As in the case of the embodiments of FIGS. 9 through 12, each of the electrical conductors in cable $22_g$ forms a fractional one-half turn secondary winding, and these may be separately connected to other electrical components or wiring on the circuit board not illustrated in the manner previously described, or have adjacent or various conductors within the cable interconnected by means of printed circuit wiring on top of the circuit board to form secondary windings of some multiple of a one-half turn winding. Additionally or alternatively, one or more windings on cable $22_g$ is interconnected with at least one of the conductors in the cable $21_g$.

Although I have illustrated the structure of my novel method and apparatus employing a flat cable containing six parallelly extending electrically insulated electrical conductors, it is apparent that other numbers of conductors may be used depending on the requirements of any specific circuit and the number of turns in the winding desired. Thus while six is illustrated, seven or more may be incorporated in which case corresponding terminals may be fabricated on the circuit board for such specific application.

The simultaneous addition of the single turn windings by the cable 21 in the embodiment of FIG. 1 may be manufactured according to one specific method by fabricating the core 1 and coil configuration 5 by conventional methods which usually involves winding coil 5, mounting the coil on the center E-shaped transformer portion and then adding the I lamination in place to clamp the coil 5 in place on the magnetic core. By taking the cable with the bare ends and looping it around the coil 5 and threading it through the clearance openings on either side of the coil between the coil and the outer coil legs, the connectors 23 and 25 may be added thereafter. Alternatively, a cable of the desired length prefabricated to include connectors 25 and 23 may be similarly threaded through the clearance between the outer core legs and looped around the coil over at least 180 degrees arcuate distance providing there is sufficient clearance between the coil and outer core legs with which to allow the connectors to be threaded through.

A still alternative manner, for example with or without connectors, is after manufacture of the coil 5 simply to loop the cable about the coil axis and insert both coil 5 and the flat cable simultaneously onto the E core prior to adding the I portion, which is thereafter accomplished. In each of the foregoing methods, the additional transformer windings are formed by looping or wrapping the flexible multiconductor cable about the periphery and axis of the generally cylindrical or rectangular type coil formed of enamel coated wire and containing the primary winding. The same methods of construction may be used to produce the structure of each of the other embodiments.

It is believed that the foregoing description of the preferred embodiments of my transformer apparatus and my method of adding windings is presented in detail sufficient to enable one skilled in the art to make and use the invention as well as to practice the method without undue experimentation. I do not intend however that the details presented for the foregoing purpose be construed to limit my invention, inasmuch as various equivalents and modifications thereto which become apparent to those skilled in the art upon reading this specification may be made, all of which contain my invention as herein disclosed. Accordingly, it is respectfully requested that my invention be broadly construed within the full spirit and scope of the appended claims.

What I claim is:

1. The electrical apparatus which comprises in combination:

a metal container means having an opening and a lid for closing said opening;

a printed circuit board of electrically insulative base material containing a plurality of flat electrical conductors on at least one surface thereof;

a first set of spaced electrical terminals and a second set of spaced electrical terminals;

a core of magnetic material forming a magnetic circuit, said core including a center core leg and first and second outer core legs located on opposite sides of said center leg and extending parallel thereto to define therebetween a coil-receiving window;

electrical coil means having an axially extending central passage comprising a first primary winding containing a first multiple number of turns of enamel insulated electrical wire and at least one secondary winding comprising a second multiple number of turns, greater than said first multiple number, of enamel covered wire with said first winding overlying said second winding and said coil including an axially extending passage, said electrical coil means being mounted along the axis thereof on said center core leg with a clearance space between the outer periphery thereof and each of said outer core legs;

an elongate relatively flat cable means having a width substantially greater than the thickness thereof and containing at least three spaced parallel conductors extending between a first and second end of said cable means in electrical insulated relationship with one another;

said cable means extending in a loop about the periphery of said electrical coil means and over an arcuate distance therearound of greater than 180 degrees but less than 360 degrees and extending through the clearance space between said periphery of said coil means and at least one of said outer core legs;

means electrically and mechanically coupling said first end of said cable means to corresponding terminals in said first set of electrical terminal means on said printed circuit board;

and means electrically and mechanically coupling the conductors at said second end of said cable to corresponding ones of said electrical terminals in said second set of electrical terminal means; and wherein each of said core, coil means, cable and printed circuit board being disposed within said container means with said core and electrical coil means supported on a surface of said printed circuit board;

a plurality of electrical components mounted on said circuit board in an electrical circuit, and means, including said plurality of flat electrical conductors on said circuit board, adapted to electrically interconnect said electrical components in circuit with each of said primary and secondary winding of said coil means, and said first and second set of electrical terminal means; and electrically insulative potting material disposed within said container for encasing said circuit board, core, coil means, cable and electrical components therewithin.

2. The invention as defined in claim 1 wherein each of said first and second means for connecting said first and second cable ends to said respective first and second set of terminal means each comprise electrical connector means.

3. The invention as defined in claims 1 or 2 wherein said printed circuit board includes at least one electrical conductor extending between one terminal means of said first set of electrical terminals and one terminal means of said second set of electrical terminals.

4. The electrical apparatus which comprises in combination:

a printed circuit board of electrically insulative base material containing a plurality of electrical conductors on at least one surface thereof;

a first set of spaced electrical terminals and a second set of spaced electrical terminals;

a core of magnetic material forming a magnetic circuit, said core including a center core leg and first and second outer core legs located on opposite sides of said center leg and axially extending parallel thereto to define therebetween a coil-receiving window;

electrical coil means having an axially extending central passage comprising a first primary winding containing a first multiple number of turns of enamel insulated electrical wire and at least one secondary winding comprising a second multiple number of turns of enamel covered wire with said first winding overlying said second winding, said electrical coil means being mounted along the axis thereof on said center core leg with a clearance space between the outer periphery thereof and each of said outer core legs;

an elongate relatively flat cable containing a plurality of spaced parallel conductors extending between a first and second end of said cable in electrical insulated relationship with one another;

said cable extending in a loop about the axis of one of said outer core legs over an arcuate distance between approximately 180 degrees and less than 360 degrees and extending through the clearance space between said periphery of said coil and said one outer core leg;

means electrically and mechanically coupling said first end of said cable to corresponding terminals in said first set of electrical terminal means on said printed circuit board;

and means electrically and mechanically coupling the conductors at said second end of said cable to corresponding ones of said electrical terminals in said second set of electrical terminal means;

a plurality of electrical components mounted on said circuit board in an electrical circuit; and means, including said plurality of flat electrical conductors on said circuit board, adapted to electrically interconnect said electrical components in circuit with each of said primary and secondary winding of said coil, and said first and second set of electrical terminal means.

5. The apparatus of claim 4 wherein the cable end extending through the clearance space further extends around the outer periphery of the coil over an arcuate distance of between approximately 180 degrees and less than 360 degrees, passes through the clearance space between the other outer core leg and the periphery of the coil means and extends about the axis of the other center core leg.

6. The apparatus of claim 5 wherein the core is oriented with respect to the printed circuit board so that the cable passes along the underside of the coil extends upward through the clearance spaces and over each of the outer core legs.

7. The electrical apparatus which comprises in combination:

a printed circuit board of electrically insulative base material containing a plurality of flat electrical conductors on at least one surface thereof;

a first set of spaced electrical terminals and a second set of spaced electrical terminals;

a core of magnetic material forming a magnetic circuit, said core including a center core leg and first and second outer core legs located on opposite sides of said center leg and axially extending parallel thereto to define therebetween a coil-receiving window;

electrical coil means having an axially extending central passage comprising a first primary winding containing a first multiple number of turns of enamel insulated electrical wire and at least one secondary winding comprising a second multiple number of turns, greater than said first multiple number, of enamel covered wire with said first winding overlying said second winding and said coil including an axially extending passage, said electrical coil means being mounted along the axis thereof on said center core leg with a clearance space between the outer periphery thereof and each of said outer core legs;

an elongate relatively flat cable containing a plurality of spaced parallel conductors extending between a first and second end of said cable in electrical insulated relationship with one another;

said cable extending in a loop about the periphery of said electrical coil means and over an arcuate distance therearound of greater than 180 degrees but less than 360 degrees and extending through the clearance space between said periphery of said coil means and at least one of said outer core legs;

means electrically and mechanically coupling said first end of said cable means to corresponding terminals in said first set of electrical terminal means on said printed circuit board;

and means electrically and mechanically coupling the conductors at said second end of said cable to corresponding ones of said electrical terminals in said second set of electrical terminal means;

a plurality of electrical components mounted on said circuit board in an electrical circuit, and means, adapted to electrically interconnect said electrical components in circuit with each of said primary and secondary winding of said coil means, and said first and second set of electrical terminal means.

8. For use with an electrical transformer of the type including:

a core of magnetic material including a center core leg and first and second outer core legs, and primary and secondary windings mounted about the core and respectively including a first and a second multiple number of turns of insulated electrically conductive wire, the primary winding being mounted around the center core leg, a method for adding a plurality of low voltage electrical windings comprising the step of:

looping a flat cable containing a plurality of spaced parallely extending insulated electrical conductors about the peripheral surface of the primary winding through an arcuate distance in the range of approximately 180 degrees to less than 360 degrees.

9. For use with an electrical transformer of the type including:

a core of magnetic material including a center core leg and first and second outer core legs, primary and secondary windings mounted about the core and respectively including a first and a second multiple number of turns of insulated electrically conductive wire, the primary winding being mounted around the center core leg, a method for adding a plurality of fractional turn windings comprising the step of:

looping a flat cable containing a plurality of spaced parallely extending insulated electrical [conducts] *conductors* about one of the outer core legs through an arcuate distance in the range of approximately 180 degrees to less than 360 degrees.

10. For use with a printed circuit board having a plurality of terminal members adapted to receive and secure the leads extending from electrical components, and an electrical transformer of the type including:

a core of magnetic material including a center core leg and first and second outer core legs, on opposite sides of the center core leg at least a portion of each outer leg extending generally parallel to the center core leg, primary and secondary windings mounted about the core and respectively including a first and a second multiple number of turns of insulated electrically conductive wire, the primary winding being mounted around the center core leg, a method comprising the steps of:

looping a flat cable containing a plurality of spaced parallely extending insulated electrical conductors under the lower peripheral surface of the primary winding so that the cable passes between the winding periphery and the outer core legs;

folding the opposite ends of the cable over the respective outer core legs; and securing the conductors at each cable end to respective terminals on the printed circuit board to form a number of additional single-turn windings about the core while simultaneously securing the transformer to the printed circuit board.

11. An improved electrical transformer of the type including:

a core of magnetic material including a center core leg and first and second outer core legs, and primary and secondary windings mounted about the core and respectively including a first and a second multiple number of turns of insulated electrical conductors, the primary winding being mounted around the center core leg, wherein the improvement comprises:

a relatively flat multi-conductor cable extending in a loop about one of the outer core legs over an arcuate distance of approximately 180 degrees to less than 360 degrees; the ends of the conductors being adapted for electrical coupling external of the transformer to function as a plurality of fractional-turn windings.

12. The transformer as defined in claim 11 wherein said plurality of conductor in said flat cable is the number six.

13. The transformer of claim 11 wherein the cable further extends about the periphery of the primary winding over an arcuate distance of approximately 180 degrees to less than 360 degrees and thereafter extends in a loop about the other outer core leg over an arcuate distance of approximately 180 degrees to less than 360 degrees whereby the electrical coupling of the cable ends to electrical components additionally secures the transformer.

14. The invention as defined in claim 13 further comprising in combination:

a flat printed circuit board;

and means securing said first and second cable ends to first and second locations on said printed circuit board to couple said electrical transformer to said circuit board.

*15. For use with an electrical transformer of the type including electrical coil means containing a primary winding and at least one secondary winding, said coil means having a central axis and a central passage co-axial with said axis; a core of magnetic material extending through the central passage to mount the coil about the core,*

*a method for adding a plurality of fractional turn windings comprising the step of looping a flat cable containing a plurality of spaced parallely extending insulated electrical conductors about the coil means so that it curves through an arcuate distance in the range of approximately 180 degrees to less than 360 degrees.*

* * * * *